United States Patent
Elaasar (10) Patent No.: US 12,483,203 B2
(45) Date of Patent: Nov. 25, 2025

(54) DIFFERENTIAL MODE AND COMMON MODE DISTORTION CANCELLATION CIRCUITRY

(71) Applicant: Apple Inc., Cupertino, CA (US)

(72) Inventor: Omar E Elaasar, San Diego, CA (US)

(73) Assignee: Apple Inc., Cupertino, CA (US)

( * ) Notice: Subject to any disclaimer, the term of this patent is extended or adjusted under 35 U.S.C. 154(b) by 657 days.

(21) Appl. No.: 17/894,062

(22) Filed: Aug. 23, 2022

(65) Prior Publication Data

US 2024/0072734 A1 Feb. 29, 2024

(51) Int. Cl.
*H03F 1/32* (2006.01)

(52) U.S. Cl.
CPC ......... *H03F 1/3211* (2013.01); *H03F 1/3205* (2013.01); *H03F 2200/451* (2013.01)

(58) Field of Classification Search
CPC ................. H03F 1/3211; H03F 1/3205; H03F 2200/451; H03F 3/195; H03F 2203/45318; H03F 3/45179
USPC ........................................................ 330/126
See application file for complete search history.

(56) References Cited

U.S. PATENT DOCUMENTS 7,276,970 B2    10/2007   Khorramabadi
7,528,656 B2 *   5/2009   Lee ..................... H03F 3/45475
                                                        330/69

FOREIGN PATENT DOCUMENTS

EP            1224735 B1    6/2010

\* cited by examiner

*Primary Examiner* — Andrea Lindgren Baltzell
*Assistant Examiner* — Jose E Pinero
(74) *Attorney, Agent, or Firm* — Treyz Law Group; Jason Tsai (57) ABSTRACT

An electronic device may include wireless circuitry having one or more differential circuits. A differential circuit can include first and second input transistors, first and second degeneration components, and first and second distortion cancellation transistors cross-coupled with the first and second input transistors. The first distortion cancellation transistor can be configured to sense a voltage at the first input transistor and to produce corresponding currents for cancelling a differential mode harmonic distortion current flowing through the second input transistor and for cancelling a common mode harmonic distortion current flowing through the first input transistor. The second distortion cancellation transistor can be configured to sense a voltage at the second input transistor and to produce corresponding currents for cancelling a differential mode harmonic distortion current flowing through the first input transistor and for cancelling a common mode harmonic distortion current flowing through the second input transistor.

20 Claims, 7 Drawing Sheets

DIFFERENTIAL MODE AND COMMON MODE DISTORTION CANCELLATION CIRCUITRY

FIELD

This disclosure relates generally to electronic devices and, more particularly, to electronic devices with wireless communications circuitry.

BACKGROUND

Electronic devices can be provided with wireless communications capabilities. An electronic device with wireless communications capabilities has wireless communications circuitry with one or more antennas. Wireless communications circuitry in the wireless communications circuitry uses the antennas to receive and transmit radio-frequency signals.

The radio-frequency signals can be fed through a transceiver. The transceiver includes mixers and amplifiers, which can be differential circuits, in the transmit and receive paths. It can be challenging to design satisfactory differential mixers and amplifiers. If care is not taken, non-linear characteristics associated with these differential circuits can degrade the overall performance and the signal difference-to-noise radio (SDNR) of the wireless communications circuitry.

SUMMARY

An electronic device that includes wireless circuitry is provided. The wireless circuitry can include differential circuits such as amplifiers, mixers, buffers, drivers, and other transmitting or receiving components. A differential circuit can include transistors exhibiting differential mode and common mode harmonic currents, which can worsen the third order intermodulation distortion of the differential circuit.

An aspect of the disclosure provides a differential circuit that includes: a first input transistor having a gate terminal configured to receive an input signal, a drain terminal coupled to a first output terminal of the differential circuit, and a source terminal; a first passive component having a first terminal coupled to the source terminal of the first input transistor and having a second terminal coupled to a power supply line; and a first distortion cancellation transistor having a gate terminal coupled to the gate terminal of the first input transistor and having a drain terminal coupled to the drain terminal of the first input transistor. The differential circuit can further include a second input transistor having a gate terminal configured to receive the input signal, a drain terminal coupled to a second output terminal of the differential circuit, and a source terminal coupled to a source terminal of the first distortion cancellation transistor; a second passive component having a first terminal coupled to the source terminal of the second input transistor and having a second terminal coupled to the power supply line; and a second distortion cancellation transistor having a gate terminal coupled to the gate terminal of the second input transistor and having a drain terminal coupled to the drain terminal of the second input transistor. The first and second passive components can be separate inductors, magnetically coupled inductors forming a transformer, or electrically coupled inductors coupled together via an impedance between the source terminals of the input transistors.

An aspect of the disclosure provides a differential circuit that includes: a first input transistor having a gate terminal configured to receive an input signal, a drain terminal coupled to a first output terminal of the differential circuit, and a source terminal; a first passive component having a first terminal coupled to the source terminal of the first input transistor and having a second terminal coupled to a power supply line; and a first distortion cancellation component having a first terminal coupled to the gate terminal of the first input transistor and having a second terminal coupled to the drain terminal of the first input transistor. The differential circuit can further include: a second input transistor having a gate terminal configured to receive the input signal, a drain terminal coupled to a second output terminal of the differential circuit, and a source terminal coupled to a third terminal of the first distortion cancellation component; a second passive component having a first terminal coupled to the source terminal of the second input transistor and having a second terminal coupled to the power supply line; and a second distortion cancellation component having a first terminal coupled to the gate terminal of the second input transistor, a second terminal coupled to the drain terminal of the second input transistor, and a third terminal coupled to the source terminal of the first input transistor.

The first and second passive components can include degeneration inductors. The first distortion cancellation component can include a first distortion cancellation transistor having a gate terminal coupled to the gate terminal of the first input transistor, a drain terminal coupled to the drain terminal of the first input transistor, and a source terminal coupled to the source terminal of the second input transistor. The second distortion cancellation component can include a second distortion cancellation transistor having a gate terminal coupled to the gate terminal of the second input transistor, a drain terminal coupled to the drain terminal of the second input transistor, and a source terminal coupled to the source terminal of the first input transistor.

An aspect of the disclosure provides a differential circuit that includes: a first input transistor having a gate terminal configured to receive an input signal, a drain terminal coupled to a first output port of the differential circuit, and a source terminal; a second input transistor having a gate terminal configured to receive the input signal, a drain terminal coupled to a second output port of the differential circuit, and a source terminal; a first distortion cancellation component coupled to the first and second input transistors, the first distortion cancellation component being configured to produce currents for cancelling a differential mode harmonic distortion current flowing through the second input transistor and for cancelling a common mode harmonic distortion current flowing through the first input transistor based on a voltage at the gate terminal of the first input transistor; and a second distortion cancellation component coupled to the first and second input transistors, the second distortion cancellation components being configured to produce currents for cancelling a differential mode harmonic distortion current flowing through the first input transistor and for cancelling a common mode harmonic distortion current flowing through the second input transistor based on a voltage at the gate terminal of the second input transistor.

The differential circuit can further include a first degeneration inductor coupled to the source terminal of the first input transistor and a second degeneration inductor coupled to the source terminal of the second input transistor. The first distortion cancellation component can include a first distortion cancellation transistor having a gate terminal coupled to the gate terminal of the first input transistor, the first distortion cancellation component being smaller than the first input transistor. The second distortion cancellation component can include a second distortion cancellation transistor having a gate terminal coupled to the gate terminal of the second input transistor, the second distortion cancellation transistor being smaller than the second input transistor. The first distortion cancellation transistor can have a first source-drain terminal coupled to the drain terminal of the first input transistor and a second source-drain terminal coupled to the source terminal of the second input transistor. The second distortion cancellation transistor can have a first source-drain terminal coupled to the drain terminal of the second input transistor and a second source-drain terminal coupled to the source terminal of the first input transistor.

DETAILED DESCRIPTION

Figure 1:
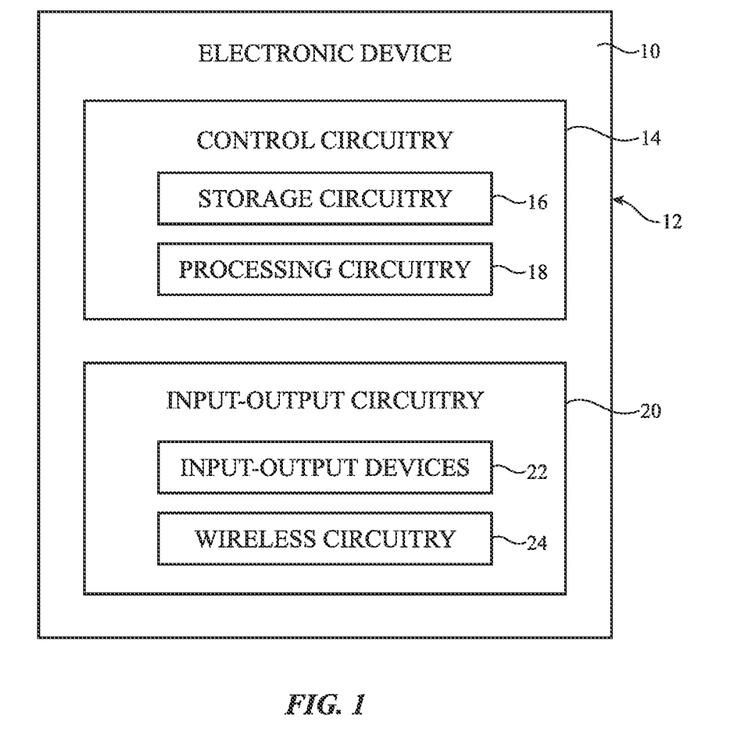
FIG. 1 is a diagram of an illustrative electronic device having wireless circuitry in accordance with some embodiments.

An electronic device such as electronic device 10 of FIG. 1 may be provided with wireless circuitry. The wireless circuitry can include differential circuits such as mixers, amplifiers, buffers, and/or other circuits having differential input ports and differential output ports. Such a differential circuit in the wireless circuitry may include input transistors, source degeneration components such as degeneration inductors coupled to the source terminals of the input transistors, and differential mode and common mode distortion cancellation components. The differential mode and common mode distortion cancellation components may include distortion cancellation transistors that are cross-coupled with the input transistors. The distortion cancellation transistors have gate terminals that are coupled to the source terminals of the input transistors or to the gate terminals of the input transistors. The input transistors may operate in strong inversion while the distortion cancellation transistors operate in weak inversion. The distortion cancellation transistors can be smaller than the input transistors. Configured and operated in this way, the distortion cancellation transistors can reduce or cancel the third order intermodulation (IM3) products associated with the differential circuit. Such differential circuit can be included in any type of electronic device 10.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
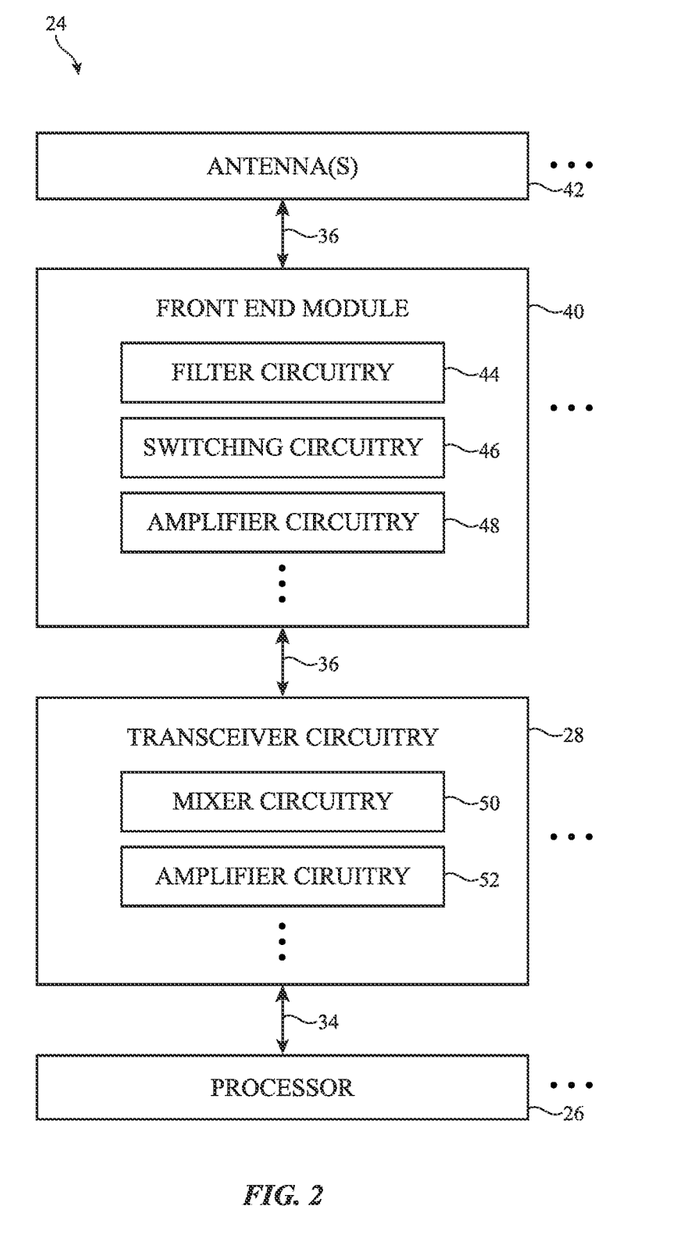
FIG. 2 is a diagram of illustrative wireless circuitry having a transceiver in accordance with some embodiments.

FIG. 2 is a diagram showing illustrative components within wireless circuitry 24. As shown in FIG. 2, wireless circuitry 24 may include one or more processors such as processor(s) 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, an application processor, a digital signal processor, a microcontroller, a microprocessor, a central processing unit (CPU), a programmable device, a combination of these circuits, and/or one or more processors within circuitry 18. Processor 26 may be configured to generate digital (transmit or baseband) signals. Processor 26 may be coupled to transceiver 28 over path 34 (sometimes referred to as a baseband path). Transceiver 28 may be coupled to antenna 42 via radio-frequency transmission line path 36. Radio-frequency front end module 40 may be disposed on radio-frequency transmission line path 36 between transceiver 28 and antenna 42.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit configured to output uplink signals to antenna 42, may include a receiver circuit configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Front end module (FEM) 40 may include radio-frequency front end circuitry that operates on the radio-frequency signals conveyed (transmitted and/or received) over radio-frequency transmission line path 36. Front end module may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifiers and one or more low-noise amplifiers), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be disposed on radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards. In one suitable arrangement, radio-frequency transmission line paths such as radio-frequency transmission line path 36 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

In performing wireless transmission, processor 26 may provide digital signals to transceiver 28 over path 34. Transceiver 28 may further include circuitry for converting the baseband signals received from processor 26 into corresponding intermediate frequency or radio-frequency signals. Transceiver circuitry 28 may also include data converters 52, which can include digital-to-analog converter (DAC) and/or analog-to-digital converter (ADC) circuitry for converting signals between digital and analog domains. For example, transceiver circuitry 28 may include a DAC circuit for converting digital signals to corresponding analog signals and mixer circuitry 50 for up-converting (or modulating) the baseband signals to intermediate frequencies or radio frequencies prior to transmission over antenna 42. Transceiver 28 may include a transmitter component to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry for converting the received radio-frequency signals into corresponding intermediate frequency or baseband signals. For example, transceiver 28 may use mixer circuitry 50 for downconverting (demodulating) the received radio-frequency signals to baseband frequencies and may use an ADC circuit for converting analog signals to corresponding digital signals prior to conveying the received signals to processor 26 over path 34. Transceiver 28 may also include one or more amplifiers such as amplifier circuitry 52 configured to amplify baseband signals, intermediate frequency (IF) signals, and/or radio-frequency signals in the transmit and/or receive path.

Wireless circuitry 24 can include differential circuits. One or more circuits within transceiver 28 such as mixer circuitry 50 and amplifier circuitry 52 can be implemented as differential circuits. Similarly, one or more circuits within radio-frequency front end module 40 such as radio-frequency power amplifier and low noise amplifier circuitry can be implemented as differential circuits. It can be challenging to design a satisfactory differential circuit for an electronic device. In practice, differential circuits are non-linear circuits whose performance is oftentimes degraded due to intermodulation distortion. Intermodulation distortion arises when at least two signals at different frequencies are applied to a non-linear circuit and when the amplitude modulation or mixing (multiplication) of the two signals when their sum is raised to a power greater than one generates intermodulation products that are not just at harmonic frequencies (integer multiples) of either input signal but also at the sums and differences of the input signal frequencies and also at sums and differences of multiples of those frequencies.

Consider a scenario in which a differential circuit receives two input signals, sometimes referred to as a first tone T1 and a second tone T2. The first tone T1 may be at angular frequency $\omega_1$ (i.e., equal to $2\pi f_1$), whereas the second tone T2 may be at angular frequency $\omega_2$ (i.e., equal to $2\pi f_2$). Angular frequency $\omega_2$ may be greater than $\omega_1$. Of particular interest are the third order intermodulation (IM3) products generated at $(2\omega_1-\omega_2)$ and $(2\omega_2-\omega_1)$. If the difference between $\omega_1$ and $\omega_2$ is relatively small, then the IM3 components generated at $(2\omega_1-\omega_1)$ and $(2\omega_2-\omega_1)$ can appear in the vicinity of $\omega_1$ and $\omega_2$. The magnitude of these IM3 tones (e.g., the third order tones appearing on either side of the two input signal tones) directly contribute to third order intermodulation distortion (IMD3), which can degrade the signal difference-to-noise ratio (SDNR), the error vector magnitude (EVM), and other performance metrics associated with the wireless circuitry.

In accordance with some embodiments, one or more differential circuit in wireless circuitry 24 can be provided with distortion cancellation components that mitigate or suppress the third order intermodulation distortion. As frequency increases, a differential circuit can exhibit a differential mode (DM) non-linearity and a common mode (CM) non-linearity both of which contribute to the overall amount of third order intermodulation distortion (IMD3). Conventional distortion cancellation techniques rely on using a passive resonant circuit for cancelling the IM3 products. A passive resonant circuit can be implemented using relatively large inductors, transformers, and capacitors. Such resonant-circuit-based distortion cancellation solutions might be effective in narrowband applications but can be challenging to design for applications with wideband requirements. Moreover, the passive components in such resonant circuits such as inductors, transformers, and capacitors can take up a significant amount of chip area, which increases the manufacturing cost of the wireless circuitry.

Figure 3:
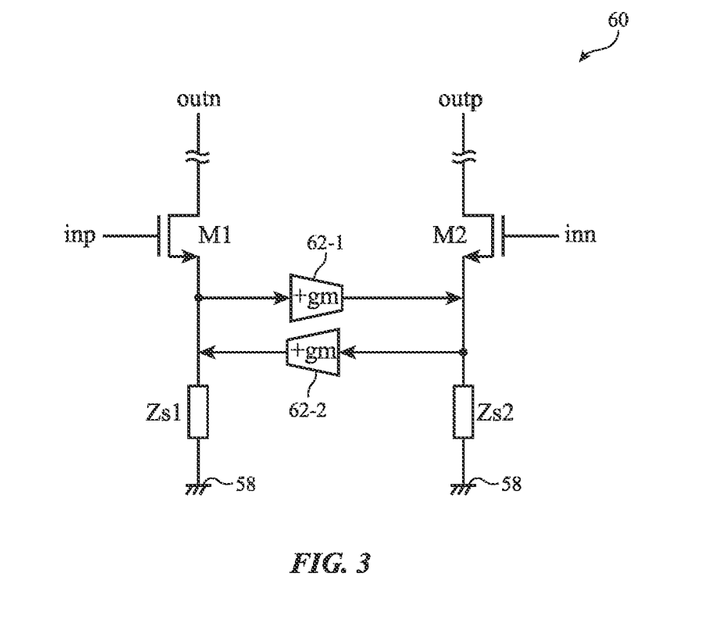
FIG. 3 is a diagram of an illustrative differential circuit having differential mode distortion cancellation components in accordance with some embodiments.

Embodiments in which a differential circuit includes active distortion cancellation components are provided. FIG. 3 is a circuit diagram of a differential circuit such as differential circuit 60 having differential mode distortion cancellation components. Differential circuit 60 may represent a mixer (e.g., a modulator or a demodulator) within mixer circuitry 50, an amplifier with amplifier circuitry 52 (e.g., a baseband amplifier in the transmit path or in the receive path), an amplifier with amplifier circuitry 48 (e.g., a radio-frequency power amplifier or a radio-frequency low noise amplifier), a buffer or driver circuit in the transmit or receive path, or other differential circuits within wireless circuitry 24.

As shown in FIG. 3, differential circuit 60 may include at least a first input transistor M1, a second input transistor M2, a first load or passive component Zs1, and a second load or passive component Zs2. First input transistor M1 may have a source terminal coupled to first load component Zs1, a drain terminal coupled to a first output terminal outn, and a gate terminal coupled to a first input terminal inp. Second input transistor M2 may have a source terminal coupled to second load component Zs2, a drain terminal coupled to a second output terminal outp, and a gate terminal coupled to a second input terminal inn. Input terminals inp and inn may collectively form a differential input port for differential circuit 60, whereas output terminals outp and outn may collectively form a differential output port for differential circuit 60. The differential input port may receive a baseband signal, a radio-frequency signal, or an intermediate frequency (IF) signal in a frequency range between a baseband frequency and a radio frequency.

The terms "source" and "drain" terminals used to refer to current-conveying terminals in a transistor may be used interchangeably and are sometimes referred to as "source-drain" terminals. Thus, the source terminal of transistor M1 can sometimes be referred to as a first source-drain terminal, and the drain terminal of transistor M1 can be referred to as a second source-drain terminal (or vice versa). Input transistors M1 and M2 can be n-type (n-channel) switches such as n-type metal-oxide-semiconductor (NMOS) devices. This is merely illustrative. If desired, one or more transistors within differential circuit 60 can instead by implemented using p-type (p-channel) switches such as p-type metal-oxide-semiconductor (PMOS) devices.

First load component Zs1 may have a first terminal coupled to the source terminal of first input transistor M1 and may have a second terminal coupled to a ground line 58 (e.g., a ground power supply line on which ground voltage Vss is provided). Load component Zs1 may be an inductor, a resistor, a capacitor, another passive component, a combination of these components, and/or other impedance or passive component. Device configurations in which Zs1 is an inductor coupled to the source terminal of input transistor M1 is sometimes described herein as an example. An inductor Zs1 coupled to the source terminal of input transistor M1 is sometimes referred to as a degeneration inductor or a source degeneration inductor. Load component Zs1 can be referred to generally as a degeneration component, a source degeneration component, a source loading component, or a degeneration impedance.

Second load component Zs2 may have a first terminal coupled to the source terminal of second input transistor M2 and may have a second terminal coupled to ground line 58. Load component Zs2 may be an inductor, a resistor, a capacitor, another passive component, a combination of these components, and/or other impedance or passive component. Device configurations in which Zs2 is an inductor coupled to the source terminal of input transistor M1 is sometimes described herein as an example. If desired, inductor Zs1 and inductor Zs2 may be separate components, may be magnetically coupled together to form a transformer, or may be electrically coupled together through an impedance between the source terminals of the first and second input transistors. An inductor Zs2 coupled to the source terminal of input transistor M2 is sometimes referred to as a degeneration inductor or a source degeneration inductor. Load component Zs2 can be referred to generally as a degeneration component, a source degeneration component, a source loading component, or a degeneration impedance.

If desired, additional cascode transistors (not shown) can optionally be coupled between the input transistors and the output terminals outn and outp. In general, output loading components such as one or more inductors, one or more capacitors, and/or other passive or active components can be coupled to the differential output port of circuit 60.

As described above, the overall third order intermodulation (IM3) products associated with differential circuit 60 can be a result of second order harmonic distortion (HD2) caused by non-linearities associated with differential circuit 60 or nearby circuits that are coupled to the input or output of circuit 60. Thus, one way of reducing the overall IM3 terms would be to cancel out or reduce any second order harmonic distortion seen within differential circuit 60. The total amount of second order harmonic distortion in differential circuit 60 might include contribution from both differential mode (DM) harmonic distortion and common mode (CM) harmonic distortion.

To understand the effects of the differential mode harmonic distortion, consider a scenario in which the first input transistor M1 receives a positive input signal at input terminal inp while the second input transistor M2 receives a negative input signal at input terminal inn. The negative input signal has an opposite polarity to the positive input signal and is sometimes referred to as being complementary to the positive input signal in a differential signaling scheme. Due to non-linearities associated with input transistor M1, the positive input signal may cause a harmonic distortion current to flow through transistor M1. Similarly, the negative input signal may cause a harmonic distortion current to flow through transistor M2 due to non-linearities associated with input transistor M2.

Degeneration impedance Zs1 can be selected so that the harmonic distortion current flowing through input transistor M1 can be sensed as a voltage at the source node of M1. Configured as such, differential circuit 60 can include a first distortion cancellation component 62-1 having an input coupled to the source node of first input transistor M1 and having an output coupled to the source node of second input transistor M2. Distortion cancellation component 62-1 can be a transconductance component that converts an input voltage signal to a corresponding output current signal with a given conversion factor gm. By selecting a positive transconductance conversion factor +gm, distortion cancellation component 62-1 can sense the harmonic distortion current as a voltage at the source node of M1 and generate a corresponding output current with an opposite polarity to the harmonic distortion current flowing through input transistor M2. As a result, the current output from component 62-1 can be used to destructively cancel out or at least partially offset the harmonic distortion current flowing through input transistor M2.

Similarly, degeneration impedance Zs2 can be selected so that the harmonic distortion current flowing through input transistor M2 can be sensed as a voltage at the source node of M2. Configured as such, differential circuit 60 can include a second distortion cancellation component 62-2 having an input coupled to the source node of first input transistor M2 and having an output coupled to the source node of first input transistor M1. Distortion cancellation component 62-2 can be a transconductance component that converts an input voltage signal to a corresponding output current signal with a given conversion factor gm. By selecting a positive transconductance conversion factor +gm (e.g., with the same polarity as component 62-1), distortion cancellation component 62-2 can sense the harmonic distortion current as a voltage at the source node of M2 and generate a corresponding output current with an opposite polarity to the harmonic distortion current flowing through input transistor M1. As a result, the current output from component 62-2 can be used to destructively cancel out or at least partially offset the harmonic distortion current flowing through input transistor M1. Components 62-1 and 62-2 of FIG. 3 that are used to cancel out the harmonic distortion currents caused by differential signals receive by the input transistors M1 and M2 can therefore sometime be referred to as differential mode (DM) distortion cancellation components.

Figure 4:
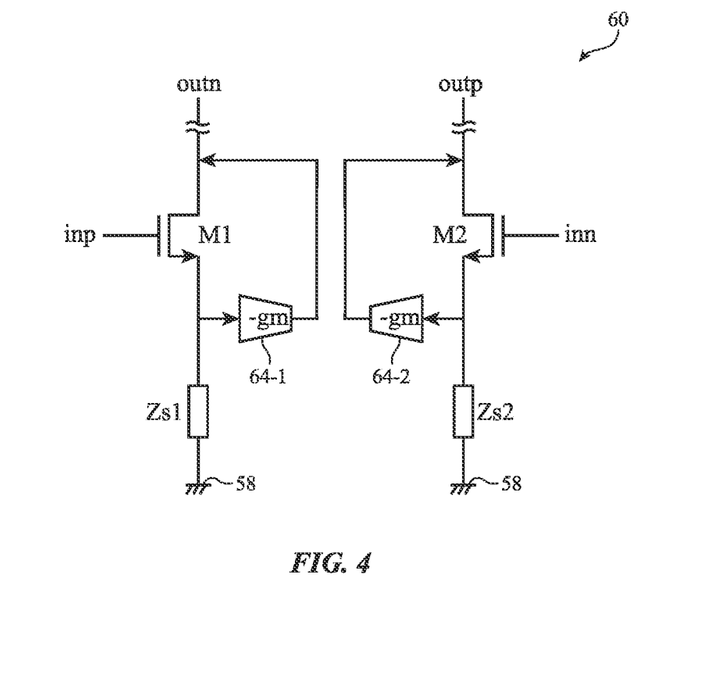
FIG. 4 is a diagram of an illustrative differential circuit having common mode distortion cancellation components in accordance with some embodiments.

As described above, the total amount of second order harmonic distortion in differential circuit 60 might include contribution from both differential mode (DM) harmonic distortion and common mode (CM) harmonic distortion. The embodiment of differential circuit 60 in FIG. 3 having differential mode distortion cancellation components 62-1 and 62-2 is exemplary. FIG. 4 shows another embodiments of differential circuit 60 having common mode distortion cancellation components such as distortion cancellation components 64-1 and 64-2.

To understand the effects of the common mode harmonic distortion, consider a scenario in which the first input transistor M1 receives a first varying bias (common mode) signal at input terminal inp while the second input transistor M2 receives a second varying bias (common mode) input signal at input terminal inn. The bias signals can vary in tandem (with the same polarity) when examining the common mode behavior at the gates of the input transistors. Due to non-linearities associated with input transistor M1, the first input common mode signal may cause a harmonic distortion current to flow through transistor M1. Similarly, the second input common mode signal may cause a harmonic distortion current to flow through transistor M2 due to non-linearities associated with input transistor M2.

Degeneration impedance Zs1 can be selected so that the harmonic distortion current flowing through input transistor M1 can be sensed as a voltage at the source node of M1. Configured as such, differential circuit 60 can include a first distortion cancellation component 64-1 having an input coupled to the source node of first input transistor M1 and having an output coupled to the drain node of M1. Distortion cancellation component 64-1 can be a transconductance component that converts an input voltage signal to a corresponding output current signal with a given conversion factor gm. By selecting a negative transconductance conversion factor −gm, distortion cancellation component 64-1 can sense the harmonic distortion current as a voltage at the source node of M1 and generate a corresponding output current with an opposite polarity. As a result, the current output from component 64-1 can be used to destructively cancel out or at least partially offset the harmonic distortion current originally flowing through input transistor M1.

Similarly, degeneration impedance Zs2 can be selected so that the harmonic distortion current flowing through input transistor M2 can be sensed as a voltage at the source node of M2. Degeneration impedances Zs1 and Zs2 can sometimes be referred to as passive degeneration components. Configured as such, differential circuit 60 can include a second distortion cancellation component 64-2 having an input coupled to the source node of first input transistor M2 and having an output coupled to the drain node of M2. Distortion cancellation component 64-2 can be a transconductance component that converts an input voltage signal to a corresponding output current signal with a given conversion factor gm. By also selecting a negative transconductance conversion factor −gm (e.g., with the same polarity as component 64-1), distortion cancellation component 64-2 can sense the harmonic distortion current as a voltage at the source node of M2 and generate a corresponding output current with an opposite polarity. As a result, the current output from component 64-2 can be used to destructively cancel out or at least partially offset the harmonic distortion current initially flowing through input transistor M2. Components 64-1 and 64-2 of FIG. 4 that are used to cancel out the harmonic distortion currents caused by common mode signals receive by the input transistors M1 and M2 can therefore sometime be referred to as common mode (CM) distortion cancellation components.

Figure 5:
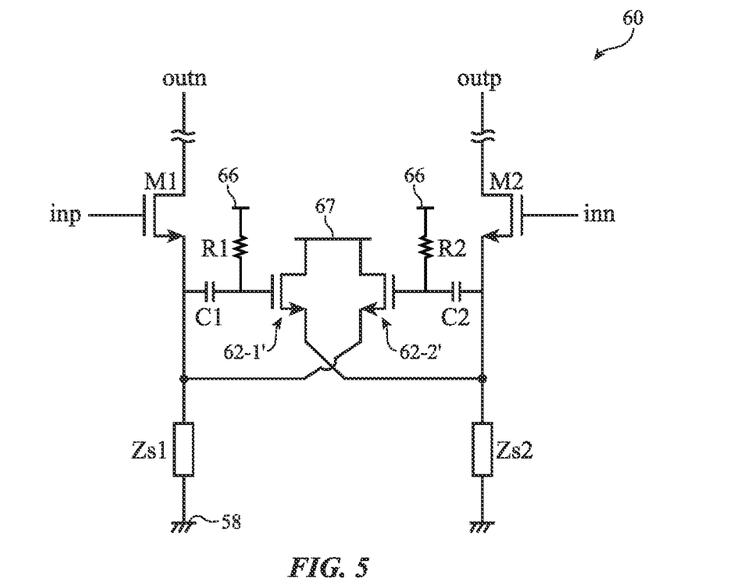
FIG. 5 is a diagram of an illustrative differential circuit having differential mode distortion cancellation transistors in accordance with some embodiments.

FIG. 5 is a circuit diagram showing how the differential mode distortion cancellation components 62-1 and 62-2 of FIG. 3 can be implemented using active components such as transistors. As shown in FIG. 5, transistor 62-1' may represent the first DM distortion cancellation component 62-1 having an input coupled to the source terminal of M1 and having an output coupled to the source terminal of M2, whereas transistor 62-2' may represent the second DM distortion cancellation component 62-2 having an input coupled to the source terminal of M2 and having an output coupled to the source terminal of M1. Transistors 62-1' and 62-2' can therefore sometimes be referred to as differential mode distortion cancellation transistors. In the example of FIG. 5, transistors 62-1' and 62-2' are implemented as n-type transistors. If desired, transistors 62-1' and 62-2' might instead be implemented as p-type transistors.

In particular, transistor 62-1' can have a drain terminal coupled to power supply line 67 (e.g., a positive power supply terminal on which a positive power supply voltage is provided), a gate terminal coupled to the source terminal of first input transistor M1 via a first coupling capacitor C1, and a source terminal cross-coupled to the source terminal of second input transistor M2. A first resistor R1 may have a first terminal coupled to the gate terminal of transistor 62-1' and a second terminal coupled to bias line 66. Bias line 66 and power supply line 67 can be provided with the same voltage or different voltages. Similarly, transistor 62-2' can have a drain terminal coupled to power supply line 67, a gate terminal coupled to the source terminal of second input transistor M2 via a second coupling capacitor C2, and a source terminal cross-coupled to the source terminal of first input transistor M1. A second resistor R2 may have a first terminal coupled to the gate terminal of transistor 62-2' and a second terminal coupled to bias line 66. Configured in this way, transistors 62-1' and 62-2' can be used to cancel out or mitigate the differential mode (DM) distortion currents associated with the input transistors M1 and M2.

Figure 6:
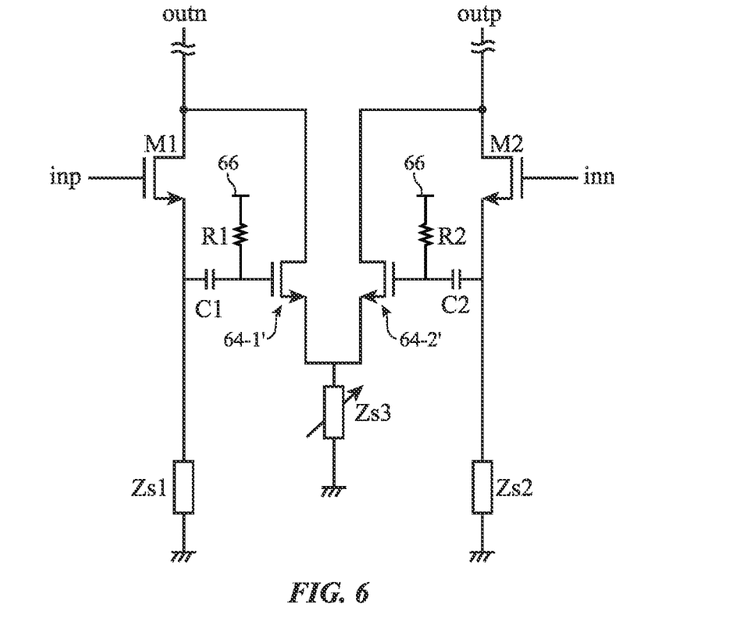
FIG. 6 is a diagram of an illustrative differential circuit having common mode distortion cancellation transistors in accordance with some embodiments.

FIG. 6 is a circuit diagram showing how the common mode distortion cancellation components 64-1 and 64-2 of FIG. 4 can also be implemented using active components such as transistors. As shown in FIG. 6, transistor 64-1' may represent the first CM distortion cancellation component 64-1 having an input coupled to the source terminal of M1 and having an output coupled to the drain terminal of M1, whereas transistor 64-2' may represent the second CM distortion cancellation component 64-2 having an input coupled to the source terminal of M2 and having an output coupled to the drain terminal of M2. Transistors 64-1' and 64-2' can therefore sometimes be referred to as common mode distortion cancellation transistors. In the example of FIG. 6, transistors 64-1' and 64-2' are implemented as n-type transistors. If desired, transistors 62-1' and 62-2' might instead be implemented as p-type transistors.

In particular, transistor 64-1' can have a gate terminal coupled to the source terminal of first input transistor M1 via a first coupling capacitor C1, a drain terminal coupled to the drain terminal of M1, and a source terminal. A first resistor R1 may have a first terminal coupled to the gate terminal of transistor 64-1' and a second terminal coupled to bias line 66. Similarly, transistor 64-2' can have a gate terminal coupled to the source terminal of second input transistor M2 via a second coupling capacitor C2, a drain terminal coupled to the drain terminal of M2, and a source terminal. A second resistor R2 may have a first terminal coupled to the gate terminal of transistor 64-2' and a second terminal coupled to bias line 66. A tail load (passive) component Zs3 can be coupled to the source terminals of transistors 64-1' and 64-2'. Tail load component Zs3 can be an inductor, a resistor, a capacitor, a transistor, a current source a combination of these components, and/or other impedance or passive component. Component Zs3 can have adjustable impedance for tuning the phase of the CM cancelling path(s) flowing through transistors 64-1' and 64-2'. Configured in this way, transistors 64-1' and 64-2' can be used to cancel out or mitigate the common mode (CM) distortion currents associated with the input transistors M1 and M2.

Figure 7:
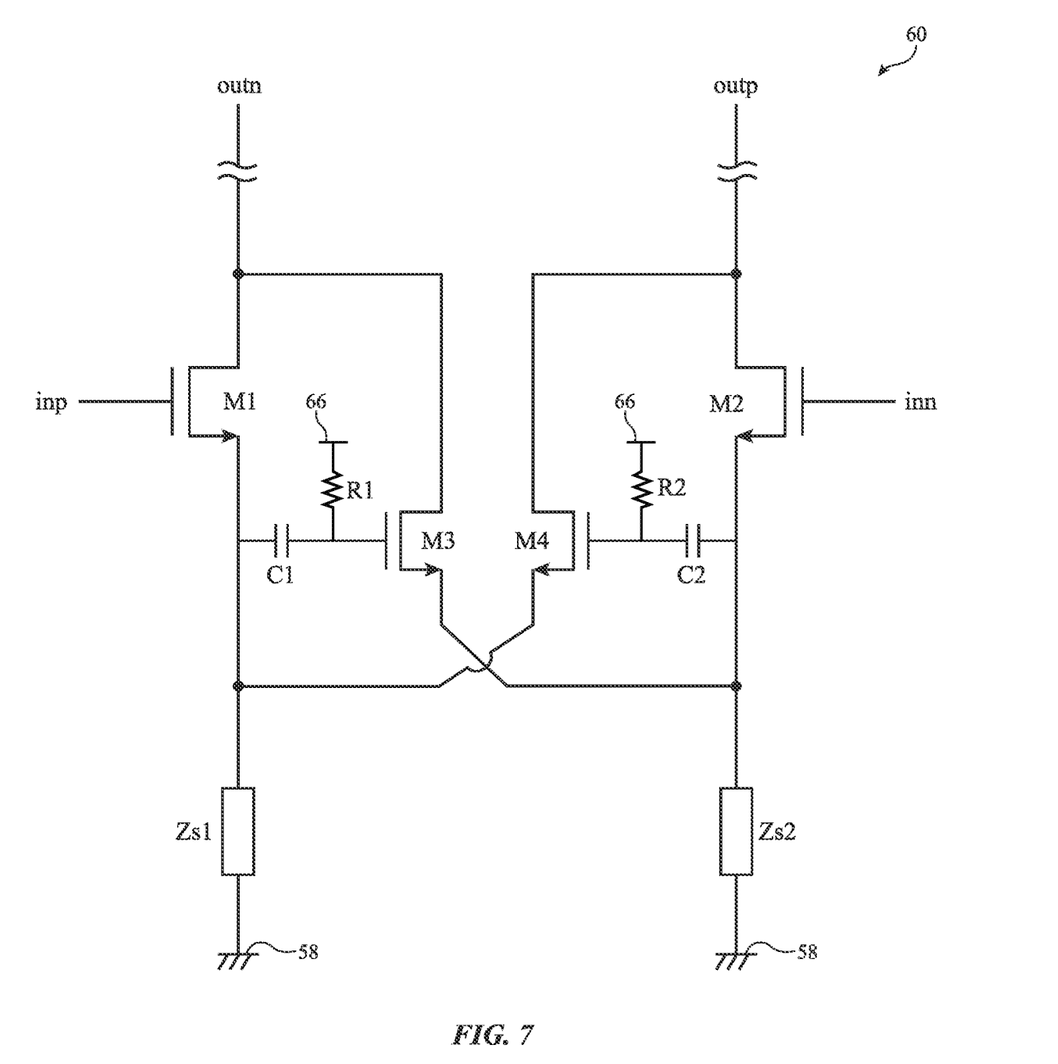
FIG. 7 is a diagram of an illustrative differential circuit having input transistors and differential mode and common mode distortion cancellation transistors with gate terminals coupled to source terminals of the input transistors in accordance with some embodiments.

The example of FIG. 5 having only DM distortion cancellation transistors and the example of FIG. 6 have only CM distortion cancellation transistors are illustrative. FIG. 7 illustrates another embodiment of differential circuit 60 that includes transistors M3 and M4 configured to provide both differential mode and common mode distortion cancellation. As shown in FIG. 7, transistor M3 may have a gate terminal coupled to the source terminal of first input transistor M1 via a first coupling capacitor C1, a first source-drain terminal (e.g., a source node) cross-coupled to the source terminal of second input transistor M2, and a second source-drain terminal (e.g., a drain node) coupled to the drain terminal of M1. A first resistor R1 may have a first terminal coupled to the gate terminal of transistor M3 and a second terminal coupled to bias line 66. Transistor M3 might be implemented as an n-type transistor (e.g., an NMOS device). Arranged in this way, the current flowing through transistor M3 can be used to simultaneously cancel out or offset the DM harmonic distortion current flowing through input transistor M2 and the CM harmonic distortion current flowing through input transistor M1.

On the other hand, transistor M4 may have a gate terminal coupled to the source terminal of second input transistor M2 via a second coupling capacitor C2, a first source-drain terminal (e.g., a source node) cross-coupled to the source terminal of first input transistor M1, and a second source-drain terminal (e.g., a drain node) coupled to the drain terminal of M2. A second resistor R2 may have a first terminal coupled to the gate terminal of transistor M4 and a second terminal coupled to bias line 66. Transistor M4 might be implemented as an n-type transistor (e.g., an NMOS device). Arranged in this way, the current flowing through transistor M4 can be used to simultaneously cancel out or offset the DM harmonic distortion current flowing through input transistor M1 and the CM harmonic distortion current flowing through input transistor M2. If desired, transistors M3 and M4 might instead be implemented as p-type transistors. Transistors M3 and M4 can therefore sometimes be referred to as differential mode (DM) and common mode (CM) distortion cancellation transistors. Using distortion cancellation transistors M3 and M4 in differential circuit 60 to reduce the differential mode and common mode harmonic distortion associated with at least the input transistors M1 and M2 can substantially reduce the third order intermodulation distortion within circuit 60 and/or surrounding circuits.

The embodiment of FIG. 7 in which the gate terminals of distortion cancellation transistors M3 and M4 are coupled to the source terminals of the input transistors M1 and M2 is illustrative. In this arrangement, the common mode voltage at the source nodes of input transistors M1 and M2 have the same polarity. As a result, the gate-to-source voltage (Vgs) across distortion cancellation transistors M3 and M4 can be very small or close to zero. In such scenarios, distortion cancellation transistors M3 and M4 needs to be fairly large to provide a sufficient amount of DM and CM distortion cancellation current to suppress the third order intermodulation distortion. For example, transistors M3 and M4 may be larger than input transistors M1 and M2, may be at least 1.5× larger than M1 and M2, 1-1.5 times larger than M1 and M2, 1.5-2 times larger than M1 and M2, 2× larger than M1 and M2, 2-5 times larger than M1 and M2, 5-10 times larger than M1 and M2, or more than 10 times larger than M1 and M2.

Figure 8:
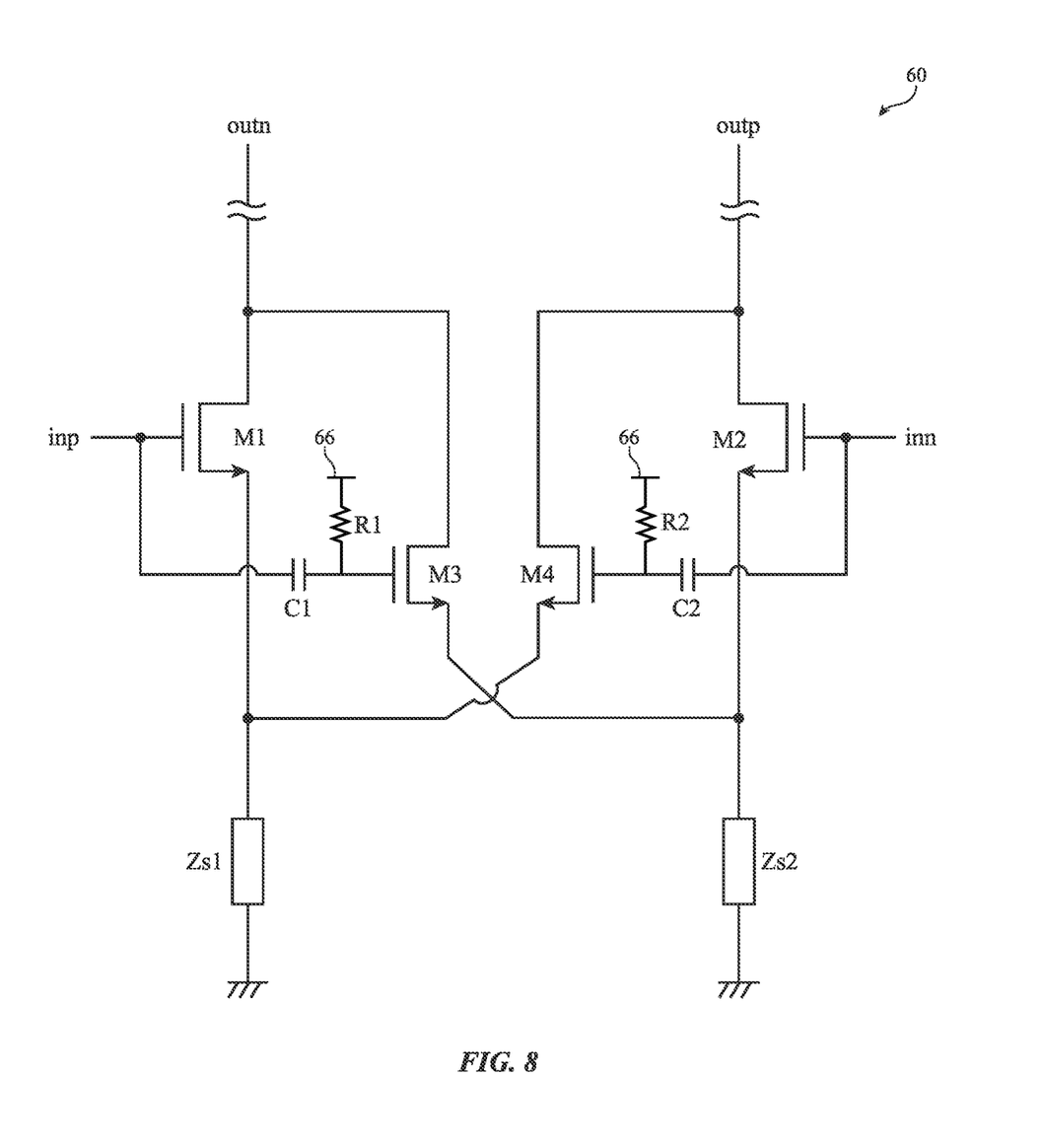
FIG. 8 is a diagram of an illustrative differential circuit having input transistors and differential mode and common mode distortion cancellation transistors with gate terminals coupled to gate terminals of the input transistors in accordance with some embodiments.

FIG. 8 illustrates another embodiment of differential circuit 60 configured to increase the gate-to-source voltage across the distortion cancellation transistors M3 and M4. As shown in FIG. 8, transistor M3 may have a gate terminal coupled to the gate terminal of first input transistor M1 via a first coupling capacitor C1, a first source-drain terminal (e.g., a source node) cross-coupled to the source terminal of second input transistor M2, and a second source-drain terminal (e.g., a drain node) coupled to the drain terminal of M1. A first resistor R1 may have a first terminal coupled to the gate terminal of transistor M3 and a second terminal coupled to bias line 66. Transistor M3 might be implemented as an n-type transistor (e.g., an NMOS device). Arranged in this way, transistor M3 can be used to sense a voltage at the gate terminal of M1 and to produce a corresponding current for simultaneously cancelling out the DM harmonic distortion current flowing through input transistor M2 and the CM harmonic distortion current flowing through input transistor M1.

On the other hand, transistor M4 may have a gate terminal coupled to the gate terminal of second input transistor M2 via a second coupling capacitor C2, a first source-drain terminal (e.g., a source node) cross-coupled to the source terminal of first input transistor M1, and a second source-drain terminal (e.g., a drain node) coupled to the drain terminal of M2. A second resistor R2 may have a first terminal coupled to the gate terminal of transistor M4 and a second terminal coupled to bias line 66. Transistor M4 might be implemented as an n-type transistor (e.g., an NMOS device). Arranged in this way, transistor M4 can be used to sense a voltage at the gate terminal of M2 and to produce a corresponding current for simultaneously cancelling out the DM harmonic distortion current flowing through input transistor M1 and the CM harmonic distortion current flowing through input transistor M2. If desired, transistors M3 and M4 in FIG. 8 might instead be implemented as p-type transistors. Transistors M3 and M4 can therefore sometimes be referred to as differential mode (DM) and common mode (CM) distortion cancellation transistors. Using distortion cancellation transistors M3 and M4 in differential circuit 60 to reduce the differential mode and common mode harmonic distortion associated with at least the input transistors M1 and M2 can substantially reduce the third order intermodulation distortion within circuit 60 and/or surrounding circuits.

By coupling the gate terminals of distortion cancellation transistors M3 and M4 to the gate terminals of the input transistors M1 and M2 as shown in FIG. 8, the gate-to-source voltage Vgs of transistors M3 and M4 can be greatly increased relative to the example of FIG. 7. In some scenarios, the Vgs of the distortion cancellation transistors M3 and M4 can be greater than or equal to the Vgs of the input transistors M1 and M2. Arranged as such, the input transistors M1 and M2 can operate in strong inversion while the distortion cancellation transistors M3 and M4 can operate in weak inversion. A transistor operating in weak inversion can provide much higher levels of harmonic current relative to a transistor operating in strong inversion. As a result, transistors M3 and M4 can be sized much smaller in the example of FIG. 8 relative to the example of FIG. 7, thus saving substantial circuit area and manufacturing cost. As an example, transistors M3 and M4 can be sized smaller than input transistors M1 and M2. If desired, transistors M3 and M4 can be minimum-sized transistors as allowed by the current fabrication process. As another example, transistors M3 and M4 can be smaller than half the size of M1 and M2. As another example, transistors M3 and M4 can be smaller than ¼ the size of M1 and M2. As another example, transistors M3 and M4 can be smaller than ⅛ the size of M1 and M2. As another example, transistors M3 and M4 can be smaller than 1/16 the size of M1 and M2. Other sizing factors can be employed.

Figure 9:
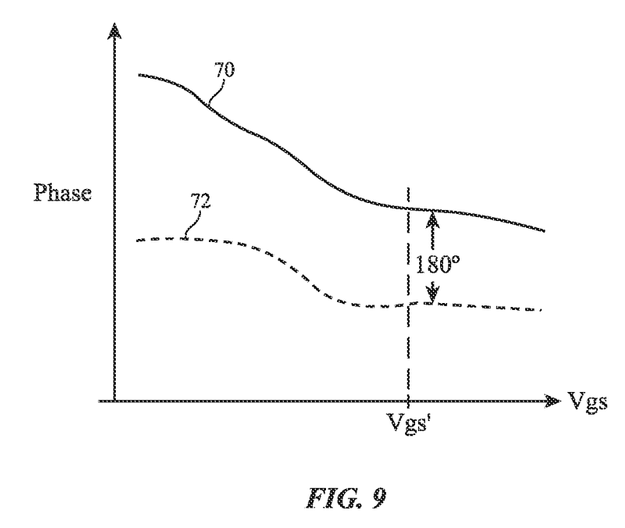
FIG. 9 is a plot showing how harmonic currents flowing through the input transistors and the distortion cancellation transistors can have opposite phases in accordance with some embodiments.

FIG. 9 is a plot showing how harmonic currents flowing through the input transistors and the distortion cancellation transistors can have opposite phases in accordance with some embodiments. Curve 70 represents the phase of a harmonic current flowing through an input transistor such as M1 and M2 over a range of Vgs across the input transistors. Curve 72 represents the phase of a harmonic current flowing through a distortion cancellation transistor such as M3 and M4 over a range of Vgs across the input transistors.

Figure 10:
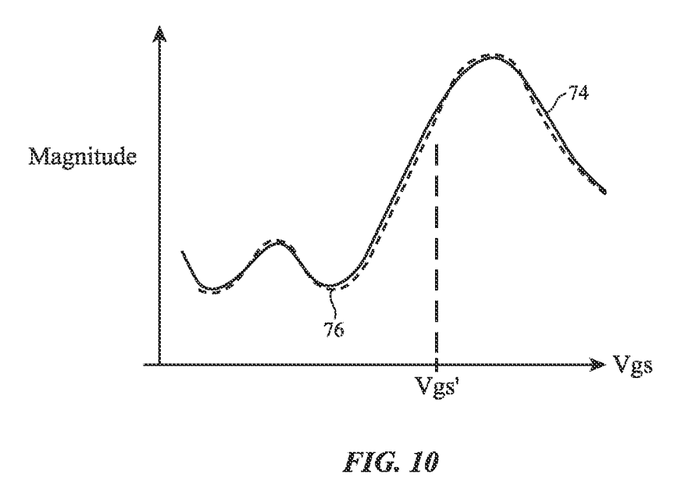
FIG. 10 is a plot showing how harmonic currents flowing through the input transistors and the distortion cancellation transistors can have the same magnitude in accordance with some embodiments.

FIG. 10 is a plot showing how harmonic currents flowing through the input transistors and the distortion cancellation transistors can have the same magnitude in accordance with some embodiments. Curve 74 represents the magnitude of a harmonic current flowing through an input transistor such as M1 and M2 over a range of Vgs across the input transistors. Curve 76 represents the magnitude of a harmonic current flowing through a distortion cancellation transistor such as M3 and M4 over a range of Vgs across the input transistors. As shown in FIG. 10, the magnitude of the harmonic current flowing through the input transistors M1 and M2 and the distortion cancellation transistors M3 and M4 can be almost identical. This can be achieved by connecting their gate terminal together as shown in FIG. 8 and by sizing transistors M3 and M4 accordingly.

As shown in FIGS. 9 and 10, a given Vgs level such as Vgs' can be selected for operating the input transistors to produce the same harmonic current magnitude while producing a 180 degree phase shift. The 180 degree phase shift between the harmonic current flowing through the input transistors and the harmonic current flowing through the distortion cancellation transistors ensures that the two currents destructively cancel out with each other. The selection of 180 degree phase shift shown in the example of FIG. 9 is illustrative. If desired, less than 180° phase shift can be used, more than 180° phase shift can be used, an amount of phase shift between 160-200° can be used, or other amounts of phase shift can be implemented by tuning Vgs.

The methods and operations described above in connection with FIGS. 1-10 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is illustrative and various modifications can be made to the described embodiments. The foregoing embodiments may be implemented individually or in any combination.

What is claimed is:

1. A differential circuit comprising:
   a first input transistor having a gate terminal configured to receive an input signal, a drain terminal coupled to a first output terminal of the differential circuit, and a source terminal;
   a first passive component having a first terminal coupled to the source terminal of the first input transistor and having a second terminal coupled to a power supply line; and
   a first distortion cancellation transistor having a gate terminal coupled to the gate terminal of the first input transistor and having a drain terminal directly coupled to the drain terminal of the first input transistor.

2. The differential circuit of claim 1 further comprising:
   a second input transistor having a gate terminal configured to receive the input signal, a drain terminal coupled to a second output terminal of the differential circuit, and a source terminal directly coupled to a source terminal of the first distortion cancellation transistor.

3. The differential circuit of claim 2 further comprising:
   a second passive component having a first terminal coupled to the source terminal of the second input transistor and having a second terminal coupled to the power supply line.

4. The differential circuit of claim 3 further comprising:
   a second distortion cancellation transistor having a gate terminal coupled to the gate terminal of the second input transistor and having a drain terminal coupled to the drain terminal of the second input transistor.

5. The differential circuit of claim 4 wherein the second distortion cancellation transistor comprises a source terminal coupled to the source terminal of the first input transistor.

6. The differential circuit of claim 5 wherein the first and second passive components comprise inductors.

7. The differential circuit of claim 1 further comprising:
   a capacitor having a first terminal coupled to the gate terminal of the first input transistor and having a second terminal configured to receive the input signal.

8. The differential circuit of claim 7 further comprising:
   a resistor coupled to a node between the gate terminal of the first input transistor and the first terminal of the capacitor.

9. A differential circuit comprising:
   a first input transistor having a gate terminal configured to receive an input signal, a drain terminal coupled to a first output terminal of the differential circuit, and a source terminal;
   a first passive component having a first terminal coupled to the source terminal of the first input transistor and having a second terminal coupled to a power supply line; and
   a first distortion cancellation component having a first terminal coupled to the gate terminal of the first input transistor and having a second terminal directly coupled to the drain terminal of the first input transistor.

10. The differential circuit of claim 9 further comprising:
    a second input transistor having a gate terminal configured to receive the input signal, a drain terminal coupled to a second output terminal of the differential circuit, and a source terminal directly coupled to a third terminal of the first distortion cancellation component.

11. The differential circuit of claim 10 further comprising:
    a second passive component having a first terminal coupled to the source terminal of the second input transistor and having a second terminal coupled to the power supply line.

12. The differential circuit of claim 11 wherein the first and second passive components comprise degeneration inductors.

13. The differential circuit of claim 10 further comprising:
    a second distortion cancellation component having a first terminal coupled to the gate terminal of the second input transistor, a second terminal coupled to the drain terminal of the second input transistor, and a third terminal coupled to the source terminal of the first input transistor.

14. The differential circuit of claim 13 wherein:
    the first distortion cancellation component comprises a first distortion cancellation transistor having a gate terminal coupled to the gate terminal of the first input transistor, a drain terminal coupled to the drain terminal of the first input transistor, and a source terminal coupled to the source terminal of the second input transistor; and
    the second distortion cancellation component comprises a second distortion cancellation transistor having a gate terminal coupled to the gate terminal of the second input transistor, a drain terminal coupled to the drain terminal of the second input transistor, and a source terminal coupled to the source terminal of the first input transistor.

15. The differential circuit of claim 14 further comprising:
a first capacitor having a first terminal coupled to the gate terminal of the first distortion cancellation transistor and having a second terminal configured to receive the input signal;
a first resistor directly coupled to the first terminal of the first capacitor;
a second capacitor having a first terminal coupled to the gate terminal of the second distortion cancellation transistor and having a second terminal configured to receive the input signal;
a second resistor directly coupled to the first terminal of the second capacitor.

16. A differential circuit comprising:
a first input transistor having a gate terminal configured to receive an input signal, a drain terminal coupled to a first output port of the differential circuit, and a source terminal;
a second input transistor having a gate terminal configured to receive the input signal, a drain terminal coupled to a second output port of the differential circuit, and a source terminal;
a first distortion cancellation component coupled to the first and second input transistors, the first distortion cancellation component being configured to produce currents for cancelling a differential mode harmonic distortion current flowing through the second input transistor and for cancelling a common mode harmonic distortion current flowing through the first input transistor based on a voltage at the gate terminal of the first input transistor; and
a second distortion cancellation component coupled to the first and second input transistors, the second distortion cancellation components being configured to produce currents for cancelling a differential mode harmonic distortion current flowing through the first input transistor and for cancelling a common mode harmonic distortion current flowing through the second input transistor based on a voltage at the gate terminal of the second input transistor.

17. The differential circuit of claim 16 further comprising:
a first degeneration inductor coupled to the source terminal of the first input transistor; and
a second degeneration inductor coupled to the source terminal of the second input transistor.

18. The differential circuit of claim 17 wherein:
the first distortion cancellation component comprises a first distortion cancellation transistor having a gate terminal coupled to the gate terminal of the first input transistor, the first distortion cancellation component being smaller than the first input transistor; and
the second distortion cancellation component comprises a second distortion cancellation transistor having a gate terminal coupled to the gate terminal of the second input transistor, the second distortion cancellation transistor being smaller than the second input transistor.

19. The differential circuit of claim 18 wherein:
the first distortion cancellation transistor has a first source-drain terminal coupled to the drain terminal of the first input transistor and has a second source-drain terminal coupled to the source terminal of the second input transistor; and
the second distortion cancellation transistor has a first source-drain terminal coupled to the drain terminal of the second input transistor and has a second source-drain terminal coupled to the source terminal of the first input transistor.

20. The differential circuit of claim 19 further comprising:
a first capacitor having a first terminal coupled to the gate terminal of the first distortion cancellation transistor and having a second terminal configured to receive the input signal; and
a second capacitor having a first terminal coupled to the gate terminal of the second distortion cancellation transistor and having a second terminal configured to receive the input signal.

* * * * *